(12) United States Patent
Yoshida et al.

(10) Patent No.: US 7,855,453 B2
(45) Date of Patent: Dec. 21, 2010

(54) SEMICONDUCTOR DEVICE

(75) Inventors: Tetsuya Yoshida, Gunma (JP); Takuji Miyata, Gunma (JP)

(73) Assignees: Sanyo Electric Co., Ltd., Moriguchi-shi (JP); Sanyo Semiconductor Co., Ltd., Gunma (JP)

( * ) Notice: Subject to any disclaimer, the term of this patent is extended or adjusted under 35 U.S.C. 154(b) by 497 days.

(21) Appl. No.: 12/055,893

(22) Filed: Mar. 26, 2008

(65) Prior Publication Data

US 2008/0237852 A1    Oct. 2, 2008

(30) Foreign Application Priority Data

Mar. 30, 2007    (JP)    ............... 2007-092665

(51) Int. Cl.
*H01L 23/48*    (2006.01)
(52) U.S. Cl. ................... 257/737; 257/E23.01
(58) Field of Classification Search .......... 257/737, 257/E23.01
See application file for complete search history.

(56) References Cited

U.S. PATENT DOCUMENTS 6,563,169 B1    5/2003    Miyakoshi et al.

2006/0030142 A1    2/2006    Grebs et al.
2008/0237631 A1*    10/2008    Watanabe ................ 257/141

FOREIGN PATENT DOCUMENTS

JP    2002-353452    12/2002
JP    2005-101334    4/2005

* cited by examiner

*Primary Examiner*—Evan Pert
*Assistant Examiner*—Krista Soderholm
(74) *Attorney, Agent, or Firm*—Morrison & Foerster LLP

(57) ABSTRACT

Provided is a semiconductor device in which a high concentration n type impurity region to be a conductive path and a drain electrode are disposed in an outer circumferential end of the chip to be an inactive region as a device region. Thereby, an up-drain structure is obtained without reducing the device region or without increasing the size of a semiconductor chip. The provided n type impurity region and drain electrode causes a depletion layer of a substrate to be terminated without needing an additional conventional annular region or shield metal. This is because the n type impurity region and the drain electrode also function as the annular region and the shield metal, respectively. With this configuration, a MOSFET with the up-drain structure having necessary components is obtained, while avoiding a reduction of the device region or an increase of the chip area.

5 Claims, 5 Drawing Sheets

SEMICONDUCTOR DEVICE

This application claims priority from Japanese Patent Application Number JP 2007-92665, filed on Mar. 30, 2007, the content of which is incorporated herein by reference in its entirety.

BACKGROUND OF THE INVENTION

1. Field of the Invention

The present invention relates to a semiconductor device, and particularly to a semiconductor device achieving effective use of a chip area by preventing current paths from concentrating heavily in a structure in which first and second electrodes respectively connected to input and output portions are provided on one of main surfaces.

2. Description of the Related Art

A semiconductor device of a discrete semiconductor (a semiconductor chip) is often provided with electrodes respectively disposed on both main surfaces (a front surface and a back surface) of a chip to be respectively connected to input and output portions. There is also known a surface-mountable type of semiconductor provided with two electrodes disposed on one main surface of a chip.

By referring to FIG. 4, the conventional surface mountable type of semiconductor device will be described by using a MOSFET as an example. FIG. 4A is a plan view, and FIG. 4B is a cross-sectional view taken along the b-b line of FIG. 4A.

An n− type semiconductor layer 111 is provided on an n+ type semiconductor substrate 110, and a p type impurity layer 112 is provided in the n− type semiconductor layer 111. Trenches 115 are formed to reach the n− type semiconductor layer 111 from a surface of the p type impurity layer 112. The inner walls of the trenches 115 are covered with a gate insulating film 116. Then, gate electrodes 117 are formed by burial in the trenches 115. Thereby, a number of MOFFET cells are provided. On a surface of the p type impurity layer 112, which is adjacent to the trench 115, n+ type source regions 114 are formed. The trenches 115 are covered with interlayer insulating films 118.

A source electrode 120 is provided to be connected to each of the source regions 114 of each cell. A gate pad electrode 121a is connected to the gate electrode 117 by a metal gate wiring 121 and a polysilicon gate wiring 125. A drain electrode 122 is provided on an n+ type region 123 in one end side region of a chip. In addition, a conductive regions 119 is provided to reach the n+ type semiconductor substrate 110 from the surface of the n+ type region 123 though the n− type semiconductor layer 111. The conductive regions 119 is in contact with the drain electrode 122.

A soldering bump 126 to be an external connection terminal is provided on each of the gate pad electrode 121a, the source electrode 120, and the drain electrode 122 (see, for example, Japanese Patent Application Publication No. 2002-353452).

In addition, FIG. 5 is a view showing a chip end portion of a general MOSFET. FIG. 5 shows a configuration provided with the source electrode 120 on one of main surfaces of a substrate and also provided with the drain electrode 122 on the other main surface thereof. The other configurations are similar to those of FIG. 4. Accordingly, the same reference numerals as those used in FIG. 4 are given to denote components similar to those of FIG. 4, and the description thereof will be omitted.

As shown in FIG. 5, in order to secure a predetermined breakdown voltage in a MOSFET, a so-called guard ring 150 is provided in an end portion of the p type impurity layer (a channel layer) 112 in which cells are disposed. In the guard ring 150, a p type impurity is diffused with high concentration. In addition, in order to prevent a substrate surface from being reversed, and to terminate expansion of a depletion layer, high concentration impurity region (an annular region) 151 is disposed in the outermost circumference of the substrate. A metal layer (shield metal) 152, which is in contact with the annular region and is not applied with any potential, is disposed on the annular region 151. The shield metal 152 is a metal layer disposed in the outermost circumference of the chip (see, for example, Japanese Patent Application Publication No. 2005-101334, on page 19, FIG. 8).

In the structure of FIG. 4, main current paths between the source electrode 120 and the drain electrode 122 are formed, as shown by arrows (in FIG. 4A), from the lower side of the source electrode 120 in which the cells are disposed, towards the conductive regions 119 and the drain electrode 122 which are disposed on one side of the chip. That is, current components gather in one region where the conductive regions 119 are collectively disposed. Accordingly, there has been a problem that on-resistance is high.

There has also been a problem that a current is biased because a difference of resistance components in a lateral direction is caused between the cells closer to the drain electrode and the cells far therefrom.

In addition, the conductive regions 119 to draw a current to the drain electrode 122, which is provided on the same main surface as that of the source electrode 120, is formed by filling the trench provided in the substrate with a conductive material, such as polysilicon or a metal layer.

In addition, as shown in FIG. 5, in the discrete device such as a MOSFET, the high concentration impurity region (the annular region) 151 in which an impurity is diffused with high concentration is provided in the end portion of the substrate, and prevents the depletion layer from reaching the end portion of the substrate. For example, there is a case where the depletion layer expanded from the guard ring reaches the end portion of the substrate when VDSS (reverse bias between a drain and a source when a gate and the source are shorted out) is applied. As a result, there is a problem that a leak current is generated.

The annular region 151 is provided in the chip end portion so as to prevent the depletion layer from reaching the chip end portion. In addition, since the annular region 151 only has to prevent the depletion layer from reaching to the chip end portion, the annular region 151 is provided in a region whose depth from the surface is relatively shallow. In addition, the annular region 151 is provided at a sufficiently-long distance from the end portion of the device region (for example, the guard ring 150) (so as not to deteriorate a breakdown voltage) in consideration of the expansion of the depletion layer. Moreover, the depletion layer from reaching the chip end portion is more effectively prevented, if widths of the annular region 151 and the metal layer (the shield metal) 152 being in contact with the annular region 151 are set to be large.

In this manner, in the case of a so-call up-drain structure in which the drain electrode 122 and the source electrode 120 are provided on the one main surface side of the chip, the conductive regions 119 for drawing a current to the drain, the drain electrode 122 and even the annular region 151 need to be disposed on the one main surface side. This causes a problem that a region in the chip end portion requires such a large area as to increase the chip size.

In contrast, if the chip size is kept from increasing, then the device region is narrowed. Accordingly, for example, a MOSFET has a problem of an increase of on-resistance.

SUMMARY OF THE INVENTION

The invention provides a discrete semiconductor element having an input portion and an output portion. The device includes a semiconductor substrate of a first general conductivity type, a semiconductor layer of the first general conductivity type disposed on the semiconductor substrate, a device region formed in the semiconductor layer and configured to operate as an active region of the discrete semiconductor element, an impurity region of the first general conductivity type formed on an edge portion of the semiconductor layer so as to surround the device region and to penetrate the semiconductor layer to reach the semiconductor substrate, a first electrode disposed on the device region and connected to the input portion or the output portion, and a second electrode comprising a metal layer and disposed on the edge portion of the semiconductor layer so as to be on and in contact with the impurity region. The second electrode is connected to the input portion or the output portion which is not connected to the first electrode.

DETAILED DESCRIPTION OF THE INVENTION

A preferred embodiment of the invention will be described in detail by referring to FIGS. 1 to 3.

A semiconductor device of a preferred embodiment of the invention is configured of a one conductivity type semiconductor substrate with high concentration, a one conductivity type semiconductor layer, a device region, a one conductivity type impurity region, a first electrode, and a second electrode. In addition, a device of a discrete semiconductor element is formed in the device region.

A discrete semiconductor element is also called an individual semiconductor and is a collective term for single-function semiconductor elements. Examples of the discrete semiconductor elements are a field-effect transistor (FET) typified by a MOSFET (Metal Oxide Semiconductor Field Effect Transistor), an IGBT (Insulated Gate Bipolar Transistor) and a junction FET, a bipolar transistor, a diode, a thyristor and the like. Furthermore, the discrete semiconductor element of the present embodiment includes a composite device in which device regions of different discrete semiconductors, such as a MOSFET and Schottky Barrier Diode (SBD), are integrated in a same substrate (a chip).

Firstly, by referring to FIG. 1, the case using a MOSFET will be described as a preferred embodiment of the invention.

Figure 1A:
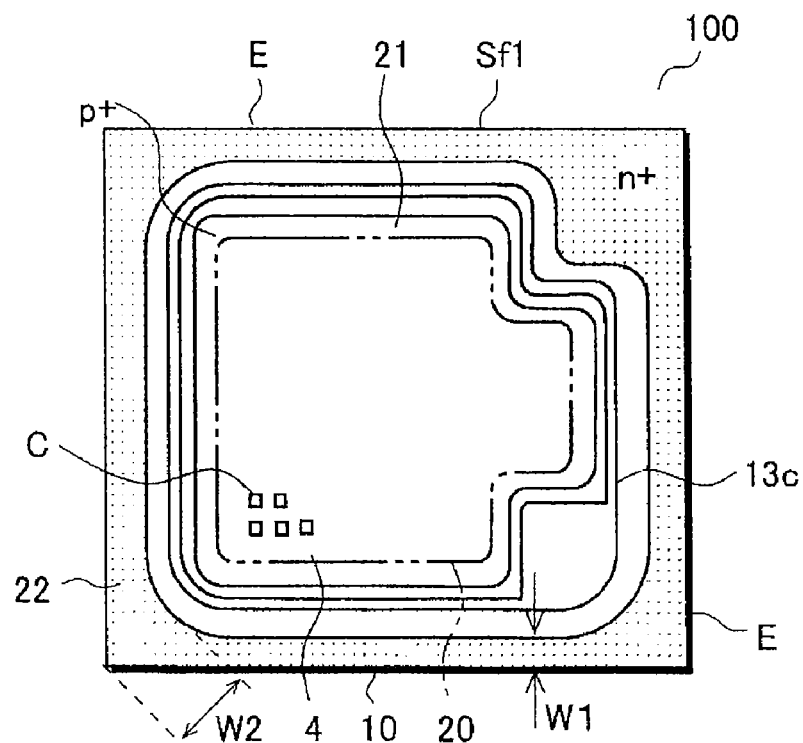
FIG. 1 is a plan view illustrating a semiconductor device of a preferred embodiment of the invention.
Figure 1B:
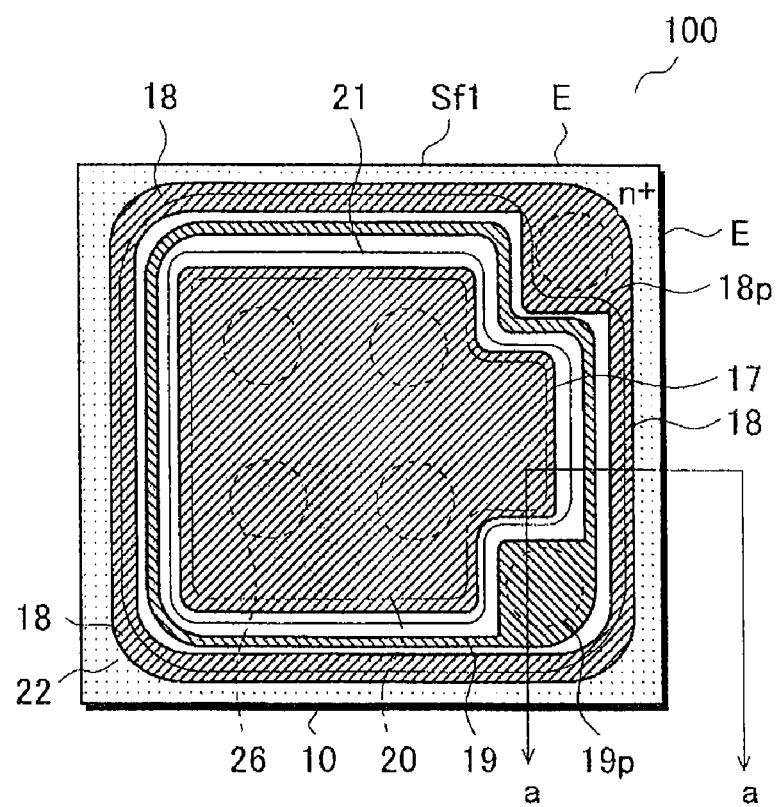

FIGS. 1A and 1B are views showing a MOSFET 100 of the present embodiment. FIG. 1A is a plan view showing a device region by omitting an electrode layer and an insulating film on one main surface side. FIG. 1B is a plan view showing the electrode layer on the one main surface side of a semiconductor chip.

As shown in FIG. 1A, a device region 20 (shown by an alternate long and two short dashes line) is provided in a substantially center of a semiconductor substrate (a semiconductor chip) 10 on a first main surface Sf1 side. A number of MOSFET cells C are disposed in a device region 20 by diffusing a desired impurity, or the like. The MOSFET cells C are provided inside a p type channel layer 4, which is provided on a surface of the first main surface Sf1 of the n type semiconductor substrate 10. A guard ring 21, which is a diffusion region of a p type impurity with high concentration, is provided along an end portion of the channel layer 4. Noted that, a region inside the guard ring 21 is referred to as the device region 20 in the present embodiment. It is noted that conductivity types such as n+, n and n− belong in one general conductivity type, and conductivity types such as p+, p and p− belong in another general conductivity type.

A high concentration n type impurity region 22 is provided across the entire circumference of the semiconductor substrate 10 in the end portion E of the semiconductor substrate 10. Here, the end portion E means a side of the substrate 10, which is exposed by dicing. More specifically, as shown in FIG. 1A by hatching, the n type impurity region 22 is a continuous region around the outermost circumference of the semiconductor substrate 10, which extends from a position spaced apart in a proper distance from the outside of the guard ring 21 to the end portion E of the semiconductor substrate 10.

The outer circumference of the n type impurity region 22 corresponds to the end portion E of the rectangular semiconductor substrate 10. In the inner circumference of then type impurity region 22, corner portions of the semiconductor substrate 10 have a predetermined curvature, and portions along the chip side are patterned along the chip edge (the end portion E).

A distance (width) W1 from the inner circumference of the n type impurity region 22 to the end portion E of the semiconductor substrate 10 is, for example, 40 μm.

In addition, the n type impurity region 22 is patterned, for example, in a pad shape which has one corner portion larger than the other corner portions. An electrode layer is formed on this large corner portion, and a bump electrode to be an external connection electrode is provided thereon, or the portion becomes a fixed region of a bonding wire.

A gate drawing electrode 13c is disposed in the outside of the device region 20 but in the inside of the n type impurity region 22. The gate drawing electrode 13c is formed of, for example, polysilicon into which an impurity is doped. The gate drawing electrode 13c is connected to an unillustrated gate electrode of the device region 20. The gate drawing electrode 13c has, for example, a pad shape in one corner portion, and, for example, a MOSFET protective diode is formed therein.

Refer to FIG. 1B. An unillustrated insulating film having openings is provided on the device region 20, and an electrode layer is disposed. The electrode layer is connected to an input/output portion of the device region 20.

The electrode layer has a first electrode 17 and a second electrode 18. The first electrode 17 is a source electrode, and the second electrode 18 is a drain electrode.

The source electrode 17 is configured of an electrode layer (a metal layer) in a plate shape, which covers the device region 20 and is in contact with a source region of the device region 20. The drain electrode 18 is configured of the electrode layer (the metal layer) in the outermost circumference of the semiconductor substrate surrounding the source electrode 17. The drain electrode 18 is in contact with the n type impurity region 22 disposed thereunder.

In the drain electrode 18, a pad portion 18p is formed in one corner portion, and the other portions are patterned in a band shape with a width of approximately 10 μm. The drain electrode 18 extends along the end portion E of the semiconductor substrate 10 by using the pad portion 18p as a leader and continuously surrounds the outer side of the source electrode 17 until the pad portion 18p.

A gate wiring electrode (a third electrode) 19 is formed of the same electrode layer as the source electrode 17 and the drain electrode 18, and is disposed therebetween. The gate wiring electrode 19 has a pattern which substantially superimposes with the gate drawing electrode 13c to be in contact with the gate drawing electrode and is connected to the gate electrode of the device region 20.

For example, as shown in circles, external connection electrodes 26 are provided in each of the source electrode 17, the drain electrode 18, and the gate wiring electrode 19. The external connection electrodes are, for example, bump electrodes, and are respectively provided in pad portions 18p and 19p in the drain electrode 18 and the gate wiring electrode 19. The electrodes 17, 18, and 19 come in contact with a source terminal S, a drain terminal D, and a gate terminal G, respectively, through the external connection electrodes 26.

Note that FIG. 1 shows 6 bump electrodes in total but the number and arrangement of the bump electrodes are not limited to that shown in the figure.

Figure 2:
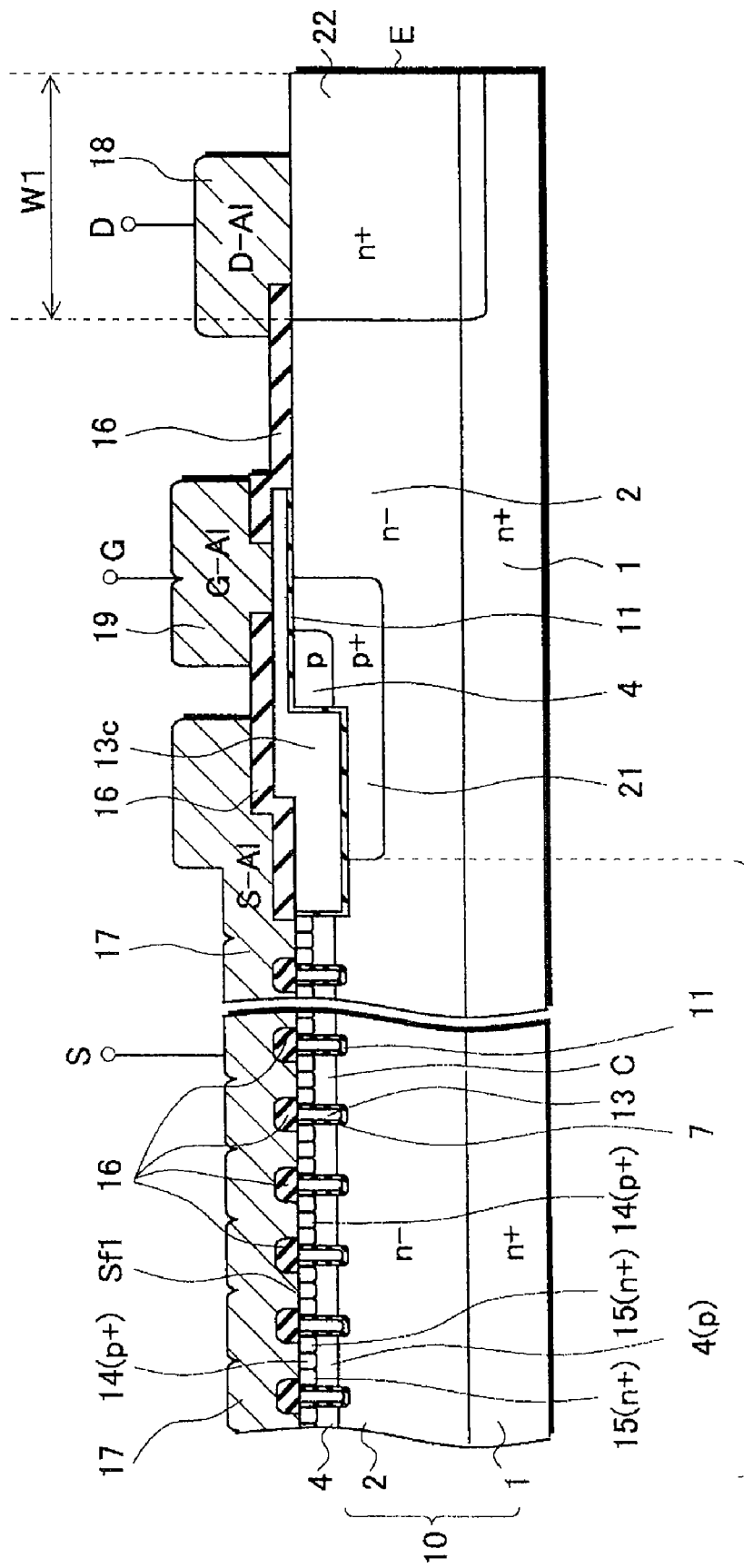
FIG. 2 is a cross-sectional view illustrating the semiconductor device of the preferred embodiment of the invention.

FIG. 2 is a cross-sectional view taken along the a-a line in FIG. 1B.

The semiconductor substrate 10 has a configuration in which an n− type semiconductor (for example, n− type epitaxial layer) 2 is provided on an n+ type silicon semiconductor substrate 1. A channel layer 4, which is a p type impurity region, is provided on a surface of the n− type semiconductor layer 2 to be the first main surface Sf1. The semiconductor substrate 10 under the channel region 4 becomes a drain region.

Trenches 7 reach the n− type semiconductor layer 2 by passing through the channel layer 4, and are generally patterned in a lattice shape or stripped shape in a plane pattern of the first main surface Sf1.

A gate oxide film 11 is provided on the inner surface of each trench 7. The film thickness of the gate oxide film 11 is set to be approximately a several hundreds Å, depending on a driving voltage of a MOSFET. In addition, a gate electrode 13 is provided by filling a conductive material inside each of the trenches 7. The conductive material is, for example, polysilicon into which an n type impurity, for example, is introduced in order to provide lower resistance.

Each source region 15 is a diffusion region into which an n type impurity with high concentration is implanted into the surface of the channel layer 4 adjacent to the trenches 7. In addition, a body region 14, which is a diffusion region of a p type impurity with high concentration, is provided in the surface of the channel layer 4 between the adjacent source regions 15, so that a potential of the substrate is stabilized. Thereby, a portion surrounded by the adjacent trenches 7 becomes one cell C of a MOS transistor. The device region 20 of a MOSFET is configured by gathering a number of the cells C.

The guard ring 21 in which a p type impurity with high concentration is diffused is provided in the outer circumference end of the device region 20. The guard ring 21 mitigates a curvature of an edge portion of a depletion layer which expands from the channel layer 4 through the n− type semiconductor layer 2 in a case where reverse direction bias is applied to the device region 20.

The gate electrode 13 is covered with an interlayer insulating film 16. The source electrode 17 is a metal electrode formed by patterning a metal layer, such as aluminum (Al), into a desired shape. The source electrode 17 is provided, on the first main surface Sf1 side of the semiconductor substrate 10, to cover over the device region 20. The source electrode 17 is connected to the source regions 15 and the body regions 14 through contact holes between the interlayer insulating films 16.

The gate electrode 13 is drawn from the substrate by the gate drawing electrode 13c, and is connected to the gate wiring electrode 19 surrounding the circumference of the device region 20. For example, the gate wiring electrode 19 is extended to a protection diode provided in the pad shaped portion of the gate drawing electrode 13c, and is connected to one end of the protection diode (see, FIG. 1A), although the illustration thereof will be omitted here. The other end of the protection diode is connected to the source electrode 17.

The n type impurity region 22, which reaches the n+ type semiconductor substrate 1 from the first main surface Sf1, is provided across the entire circumference of the end portion E of the semiconductor substrate 10. Then type impurity region 22 is provided at a certain distance spaced apart from the guard ring 21 to the end portion E of the semiconductor substrate 10, and is a diffusion region outside of the gate wiring electrode 19, and is provided from under the drain electrode 18 to the end portion E of the semiconductor substrate 10. The n type impurity region 22 is exposed from the side (of the end portion E) of the semiconductor substrate 10.

The drain electrode 18 is a metal layer in the outermost circumference of the semiconductor substrate 10, and a part thereof superimposes and is in contact with the n type impurity region 22. The outer circumference of the drain electrode 18 is in the inside of the end portion E of the semiconductor substrate 10. The surface of a part of the n type impurity region 22 is exposed from the drain electrode 18 as shown in FIG. 2.

Refer to FIG. 1 again. The drain electrode 18 and the n type impurity region 22 are formed in the patterns which continuously surround the outside of the source electrode 17. The n type impurity region 22 has a pattern similar to the pad portion 18p under the pad portion 18p of the drain electrode 18.

An impurity concentration of the n type impurity region 22 is higher than that of the n− type semiconductor layer 2. The n type impurity region 22 reaches the n+ type semiconductor substrate 1. The n type impurity region 22 becomes a conductive path, which draws, with a low resistance, a current flowing through the substrate 10 to the drain electrode. Accordingly, a current path is formed between the source electrode 17, the source region 15, the channel layer 4, the n− type semiconductor layer 2, the n+ type semiconductor substrate 1, the n type impurity region 22, and the drain electrode 18.

In the present embodiment, the drain electrode 18 and the n type impurity region 22 are disposed across the entire circumference of the semiconductor substrate (the semiconductor chip) 10 as shown in FIG. 1A and FIG. 1B. That is, the conductive path drawing a current and the drain electrode 18 are dispersed across the entire circumference of the chip. For this reason, the drawn currents are not concentrated.

Figure 4A:
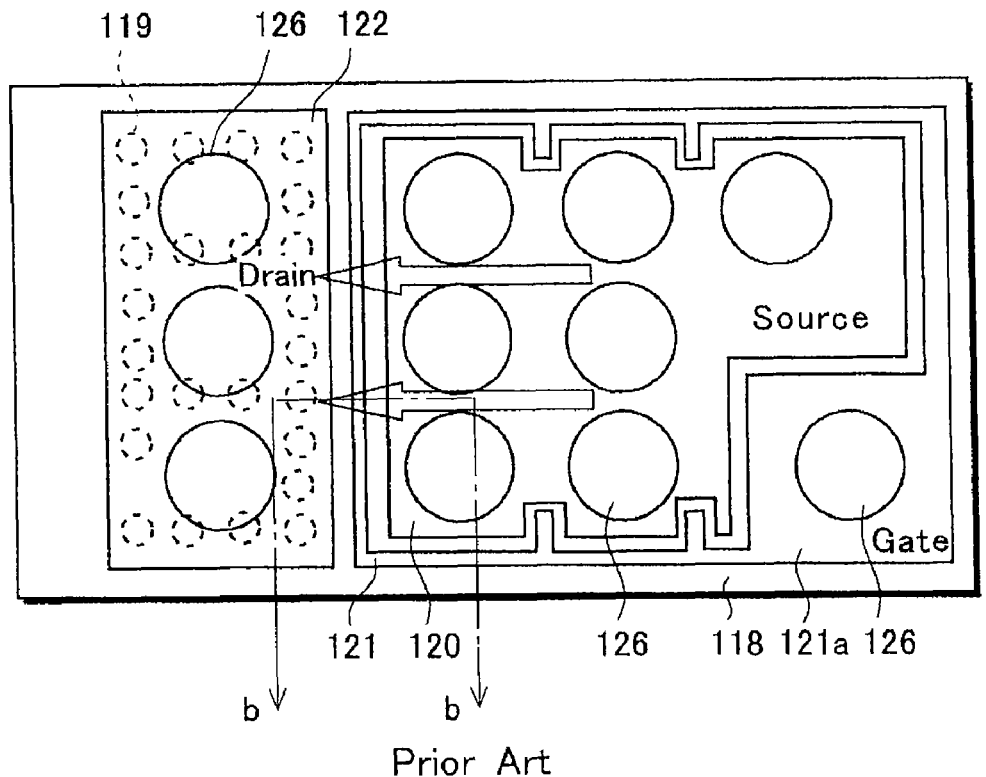
FIG. 4A is a plan view illustrating a conventional semiconductor device and FIG. 4B is a cross-sectional view thereof.
Figure 4B:
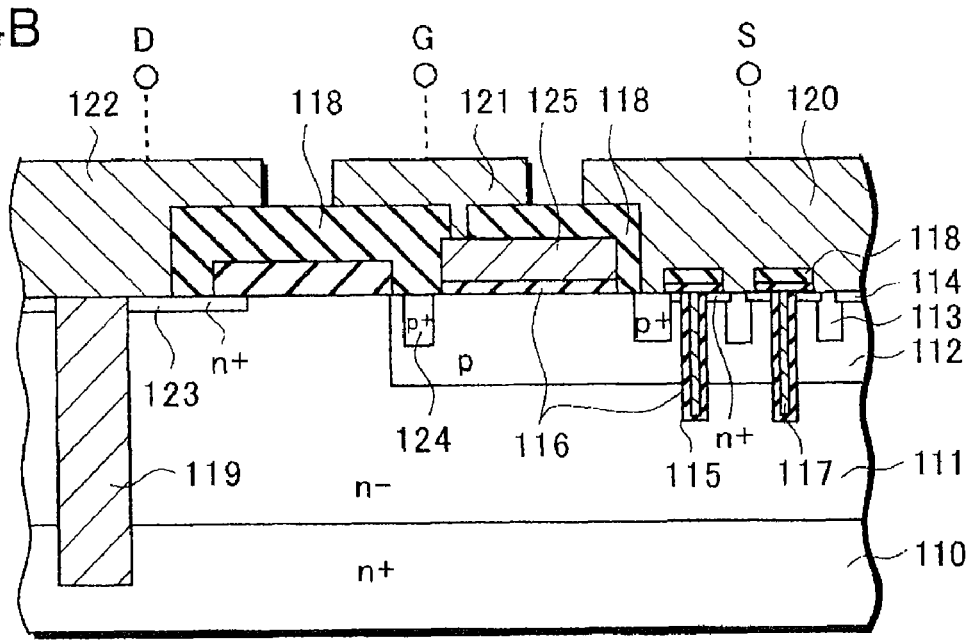

Conventionally, as shown in FIG. 4, the drain electrode 122 and the conductive regions 119 are intensively disposed on the one end side of the chip. Thus, currents are concentrated in one region. This causes a problem that the drawing resistance of a current is increased. However, according to the present embodiment, it is made possible that the increase of the drawing resistance due to the current concentration is avoided and that on-resistance is reduced.

In the present embodiment, the conductive path to draw the drain current (the n type impurity region 22) and the drain electrode 18 are provided in the chip end portion. Thereby, a region where can be utilized as the device region 20 is expanded.

Refer to FIG. 4. In the conventional up-drain structure in which the drain electrode 122 is disposed on the main surface side same as the source electrode 120, the conductive path (the conductive regions 119) and the drain electrode 122 are disposed. Thus, there has been a problem that the device region is miniaturized or the chip size is increased.

However, in the present embodiment, the conductive path (the n type impurity region 22) and the drain electrode 18 are placed in an inactive region in the outer circumferential end of the chip where the cells C of the MOSFET are not originally formed. Accordingly, the miniaturization of the device region 20 or the increases in size of the chip, which are caused by adopting the up-drain structure, can be avoided.

In addition, in the present embodiment, the n type impurity region 22 and the drain electrode 18 can provide functions of the annular region and the shield metal in the conventional structure.

Figure 5:
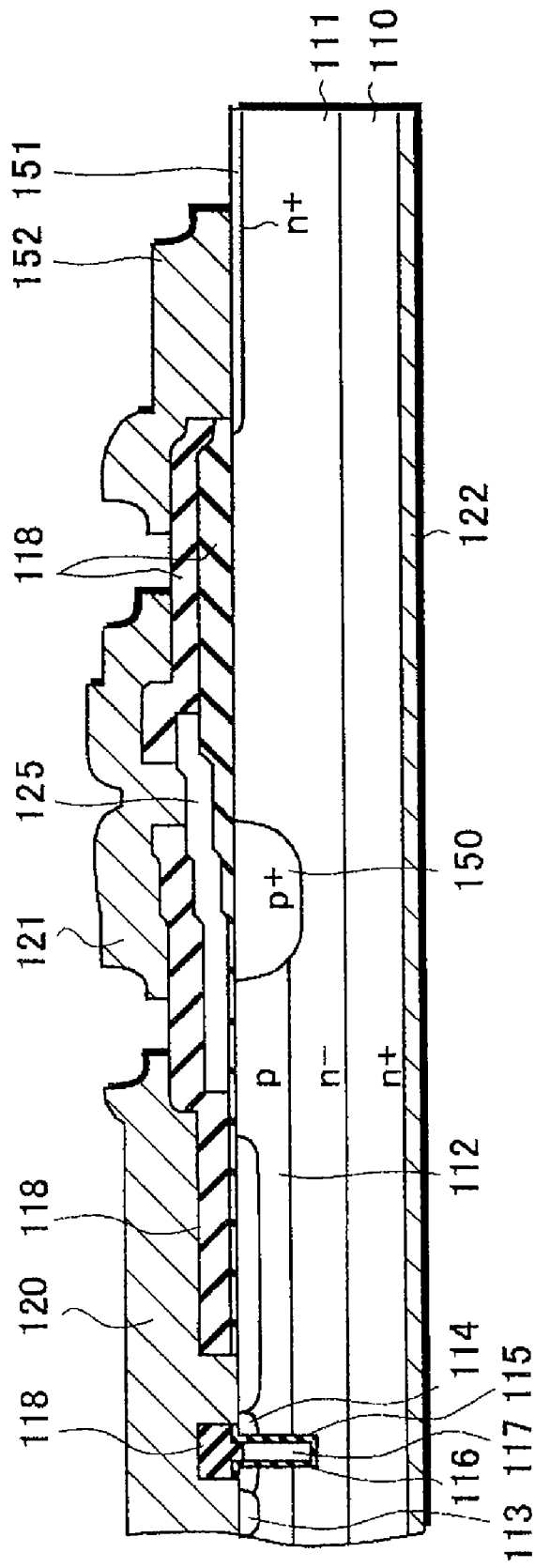
FIG. 5 is a cross-sectional view illustrating the conventional semiconductor device.

FIG. 5 shows a discrete device, such as a MOSFET, with the conventional structure. In general, in such a discrete device, the annular region 151 in which an impurity is diffused with high concentration in the outer circumferential end of the chip is provided so that a depletion layer can be prevented from reaching to the chip end portion. For example, when a VDSS breakdown voltage (a breakdown voltage of reverse bias between a drain and a source when a gate and the source are shorted out) is applied, the depletion layer reaches the chip end portion to cause leak of an IDSS current. For this reason, the annular region 151 in which a high concentration impurity is diffused is provided on the substrate surface in the outer circumferential end of the chip, and a metal layer (a shield metal) into which no potential is applied is disposed thereon, so that the depletion layer would not reach the chip end portion E.

In this case, it is effective that a width of the annular region 151 (and the shield metal 152) be set to be larger in order to prevent inversion. However, if the width is set to be excessively larger, the circumferential region on the outside of the device region is expanded. Accordingly, the chip size is increased. In addition, if the expansion of the chip size is suppressed, the device region is small. As a result, for example, in the case of a MOSFET, the reduction of on resistance is not advanced.

As described above, in the case of the conventional up-drain structure, the conductive path (the conductive regions 119) to draw the current and the drain electrode (122) have to be additionally disposed to the structure of the foregoing description. This further causes a problem that the device region is miniaturized or the chip size is increased.

However, according to the present embodiment, the n type impurity region 22 to be the conductive path is provided in the utmost end portion E of the substrate 10 so as to be exposed from the side of the substrate 10, and the drain electrode 18 is disposed on the n type impurity region 22 (FIG. 2). The n type impurity region 22 has a width of approximately 40 μm and an impurity concentration of about $1E19$ cm$^{-3}$, both of which essentially the same as those of the conventional annular region. As a result, the n type impurity region 22 prevents the depletion layer from reaching the chip end portion E.

In addition, when reverse direction bias is applied to a MOSFET, the depletion layer expanding in the n− type semiconductor layer 2 can be terminated by the n type impurity region 22 with high concentration. That is, the n type impurity region 22 also functions as the conventional annular region, and the drain electrode 18 functions as the conventional shield metal.

Thereby, in the present embodiment, an additional provision of the annular region and the shield metal is not necessary. In addition, the peripheral region of the chip in the outer circumference of the device region is effectively utilized so that a necessary configuration can be provided. Accordingly, the expansion of the device region 20 or the miniaturization of the chip is achieved.

Refer to FIG. 1A again. The shape of the semiconductor substrate 10 (semiconductor chip) is generally rectangular. For example, the n type impurity region 22 provided in the outer circumference of the device region 20 is formed by a pattern having corner portions with a predetermined curvature in the plane pattern of the first main surface Sf1, for example.

A width W1 of the n-type impurity region 22 provided along the edge (the chip edge) of the semiconductor substrate 10 and the curvature at the corner portions are designed depending on the characteristics of the semiconductor device. Since the n type impurity region 22 is provided up to the end portion E of the semiconductor substrate 10, a width W2 at the corner portion is wider than the width W1 of the n type impurity region 22 along the edge of the semiconductor substrate 10. The incremental width becomes a complete inactive region which does not affect the characteristics of the semiconductor device.

Accordingly, in the present embodiment, the n type impurity region 22 and the drain electrode 18 are provided by utilizing the inactive region at the corner portion. Thereby, areas of the n type impurity region 22 to be the conductive path and the drain electrode 18 can be increased.

Figure 3A:
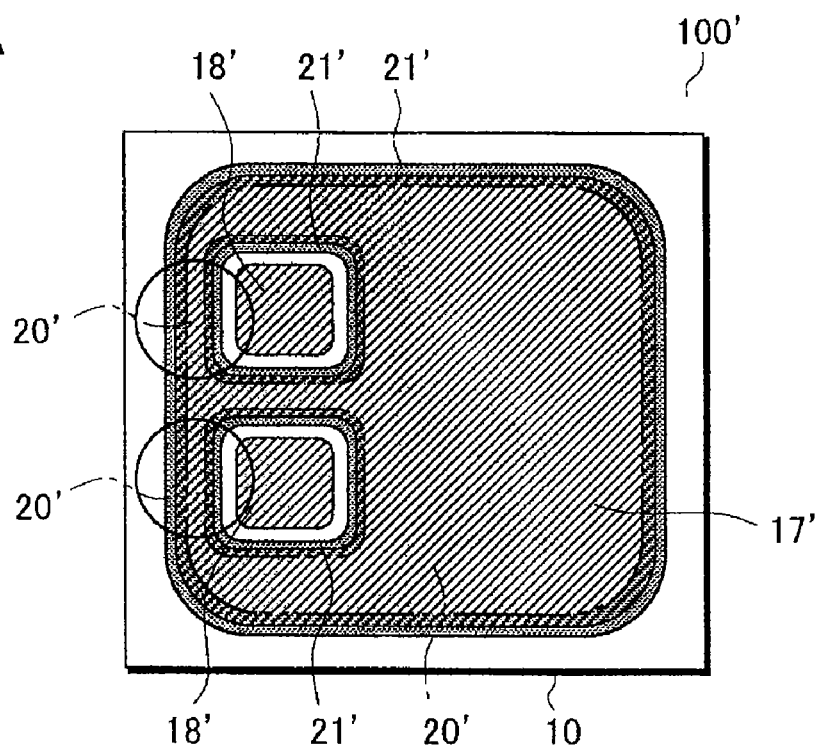
FIG. 3 is a plan view illustrating the semiconductor device of the preferred embodiment of the invention.
Figure 3B:
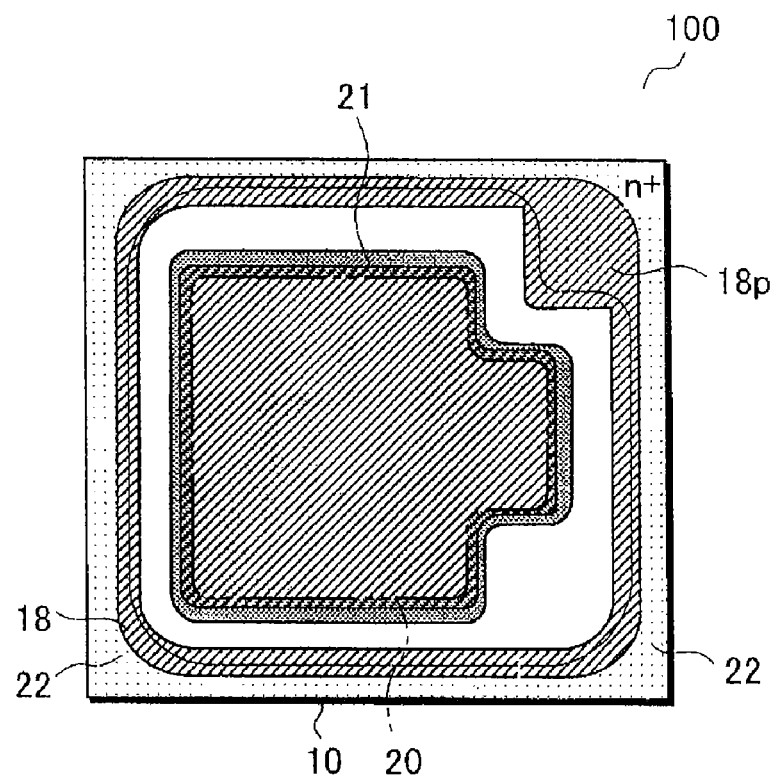

Furthermore, by referring to FIG. 3, a pattern of the guard ring of the present embodiment will be described. FIG. 3A is a plan view of a semiconductor chip 100' in which a drain electrode 18' is provided in an independent island shape in the up-drain structure as a comparative example of the present embodiment. FIG. 3B is a pattern of the present embodiment. Note that a gate wiring electrode (and pad portion thereof) is omitted in FIGS. 3A and 3B.

As shown in FIG. 3A, if drain electrode 18, are provided in an independent island shape, guard rings 21' to be disposed in the end portions of device regions 20' are disposed along the edge of a source electrode 17' surrounding drain electrode 18'. That is, the guard rings 21' are disposed in the outer circumferential end of the chip and the end of the source electrode 17' around drain electrode 18'. For example, in portions shown by circles, the guard rings 21' are densely disposed. A cell cannot be disposed in the region where the guard rings 21' are formed. Consequently, the areas of the device regions 20' are small.

On the other hand, as shown in FIG. 3B, the guard ring 21 is disposed along the inner side of the drain electrode 18 in the present embodiment. Accordingly, the region where the guard ring 21 is formed is made minimum so as to increase the area of the device region 20.

The present embodiment has been described by taking, as an example, the case where the drain electrode 18 is patterned into a shape with the pad portion 18p and the n type impurity region 22 thereunder is also patterned into a pad shape (FIG. 1).

Since the n type impurity region 22 as the conductive path is connected to the drain electrode 18 to draw a current, the areas of the n type impurity region 22 and the drain electrode 18 is selected depending on a drawing resistance of the current, if needed. For example, if the size of the device region 20 is large (the chip size is large), a current flowing therethrough is also large. For this reason, the area as the conductive path may be increased by providing, for example, the pad portion 18p (similarly, then type impurity region 22) as shown in FIG. 1.

In contrast, if the area of the device region 20 is small (the chip size is small), the areas of the drain electrode 18 and the n type impurity region 22 may be also relatively small. For example, instead of providing the pad portion 18p, a ring shape pattern may be provided in the outer circumference end of the chip. With this configuration, however, a connection region to a bump electrode and the like to be an external connection electrode cannot be sufficiently secured on the drain electrode 22 in some cases. If so, a multi-layered structure may be employed for the electrode layer of the first main surface Sf1. Specifically, the first layer of the drain electrode 18 is formed in a ring shape, and the external connection electrode (or wire bonding region) is provided in the electrode layer in the second layer.

As described above, in the present embodiment, a MOSFET has been described as an example. However, the preferred embodiment of the invention is not limited to this and can be similarly applied to diodes and bipolar transistors.

According to the preferred embodiment of the invention, firstly, the n type impurity region which is exposed from the side of the substrate is disposed across the entire circumference of the chip (the semiconductor substrate) end portion surrounding one first electrode, and is set to be a conductive path. The second electrode is provided on the n type impurity region. Thereby, a current path flowing from the first electrode to the second electrode can be dispersed in the entire circumference of the chip, and the current can be drawn therethrough. Accordingly, the drawing of the current flowing through the substrate does not concentrate in one portion, and on-resistance can be reduced.

Secondly, the n type impurity region and the second electrode in the chip end portion can prevent the depletion layer from reaching the chip end portion.

Conventionally, an impurity region with high concentration (an annular region) is provided on the surface of the chip end portion, and a metal layer (a shield metal) into which no potential is applied is disposed thereon, so that inversion of the substrate is prevented. The larger widths of the annular region and the shield metal can provide a higher effect of preventing the inversion. However, if the widths are made excessively wider, adverse effects, such as expansion of chip size or reduction in size of the device region, become larger.

According to the present embodiment, however, the area of the periphery region of the semiconductor chip can be utilized. That is, the n type impurity region to be a conductive path is provided in the utmost end portion of the substrate so as to be exposed from the side of the substrate, and the second electrode is disposed on the n type impurity region. Thereby, the n type impurity region and the second electrode can also function as the annular region and the shield metal, respectively.

Since a transistor cell cannot be disposed in the annular region, the annular region is an inactive region as a device region. In addition, the region where the conductive path drawing a current of the substrate is formed is also an inactive region as a device region. In the present embodiment, the conductive path and the second electrode are provided in the inactive regions as a device region. The device of this embodiment includes these inactive regions any way. So, the use of the inactive regions described above increases the active region where operational device elements such as the cell described above are formed. Thereby, the miniaturization of the chip or the reduction of on-resistance due to the expansion of the device region are achieved.

In addition, the second electrode and the n type impurity region to be a conductive path are disposed in the entire circumference. Accordingly, the total area can be sufficiently secured, and the increase in resistance of drawing a current can be avoided.

Thirdly, the guard ring disposed in the end portion of the device region can be effectively provided between the first and second electrodes, so that the space of the device region can be expanded.

Fourthly, the inactive region at a corner portion can be effectively utilized. In general, the chip has a rectangular shape. The conventional annular region is formed with a width wider than the region along the chip edge by using a pattern with a predetermined curvature. In the present embodiment, the corner portion can be utilized also as the region where the conductive path and the second electrode are disposed. Accordingly, the sufficient area as the conductive path and the second electrode can be secured, which can contribute to the reduction of on-resistance.

What is claimed is:

1. A discrete semiconductor element comprising an input portion and an output portion, comprising:
   a semiconductor substrate of a first general conductivity type;
   a semiconductor layer of the first general conductivity type disposed on the semiconductor substrate;
   a device region formed in the semiconductor layer and configured to operate as an active region of the discrete semiconductor element;
   an impurity region of the first general conductivity type formed on an edge portion of the semiconductor layer so as to surround the device region and to penetrate the semiconductor layer to reach the semiconductor substrate;
   a first electrode disposed on the device region and connected to the input portion or the output portion; and
   a second electrode comprising a metal layer and disposed on the edge portion of the semiconductor layer so as to be on and in contact with the impurity region, the second electrode being connected to the input portion or the output portion which is not connected to the first electrode.

2. The discrete semiconductor element of claim 1, wherein the second electrode surrounds the first electrode without any break.

3. The discrete semiconductor element of claim 1, further comprising a third electrode disposed between the first and second electrodes and connected to the device region.

4. The discrete semiconductor element of claim 1, further comprising an impurity region of a second general conductivity type formed in the semiconductor layer so as to be disposed between the device region and the second electrode.

5. The discrete semiconductor element of claim 1, further comprising a first bump electrode formed on the first electrode and a second bump electrode formed on the second electrode.

* * * * *